United States Patent
Takasone

(10) Patent No.: US 7,608,525 B2
(45) Date of Patent: Oct. 27, 2009

(54) METHOD FOR MANUFACTURING NITRIDE SEMICONDUCTOR SUBSTRATE

(75) Inventor: Toru Takasone, Tokushima (JP)

(73) Assignee: Nichia Corporation, Anan-shi (JP)

( * ) Notice: Subject to any disclaimer, the term of this patent is extended or adjusted under 35 U.S.C. 154(b) by 234 days.

(21) Appl. No.: 11/525,906

(22) Filed: Sep. 25, 2006

(65) Prior Publication Data

US 2007/0096262 A1    May 3, 2007

(30) Foreign Application Priority Data

Oct. 28, 2005  (JP) .............................. 2005-314688
Aug. 21, 2006  (JP) .............................. 2006-224023

(51) Int. Cl.
*H01L 21/20* (2006.01)
*H01L 21/36* (2006.01)

(52) U.S. Cl. ....................... 438/479; 438/462; 438/110; 257/94; 257/628

(58) Field of Classification Search ................. 438/479, 438/462, 110; 257/94, 628
See application file for complete search history.

(56) References Cited

U.S. PATENT DOCUMENTS

| | | | |
|---|---|---|---|
| 6,153,010 A | 11/2000 | Kiyoku et al. | |
| 6,468,347 B1 | 10/2002 | Motoki et al. | |
| 2001/0053618 A1 * | 12/2001 | Kozaki et al. | ............... 438/933 |
| 2002/0048909 A1 | 4/2002 | Biwa et al. | |
| 2005/0227458 A1 | 10/2005 | Kobayashi et al. | |

FOREIGN PATENT DOCUMENTS

| | | |
|---|---|---|
| EP | 1244140 A2 | 9/2002 |
| JP | H11-191657 A | 7/1999 |
| JP | 2000-223417 A | 8/2000 |
| JP | 2001-102307 A | 4/2001 |

* cited by examiner

*Primary Examiner*—Thanh V. Pham
*Assistant Examiner*—Caleb Henry
(74) *Attorney, Agent, or Firm*—Global IP Counselors, LLP

(57) ABSTRACT

A method for manufacturing a nitride semiconductor substrate comprises the steps of: growing a first nitride semiconductor on a substrate, patterning the first nitride semiconductor to obtain a pattern surrounded by a plane equivalent to the (11-20) plane and having at least two concave portions that are similar in their planar shape, and growing a second nitride semiconductor layer, using a plane equivalent to the (11-20) plane in the first nitride semiconductor pattern as a growth nucleus.

5 Claims, 6 Drawing Sheets

METHOD FOR MANUFACTURING NITRIDE SEMICONDUCTOR SUBSTRATE

BACKGROUND OF THE INVENTION

1. Field of the Invention

The present invention relates to a method for manufacturing a nitride semiconductor substrate, and more particularly relates to a method for manufacturing a nitride semiconductor substrate with reduced dislocation and warpage.

2. Description of the Prior Art

It is known that nitride semiconductors, which are utilized to form LEDs, LDs, and other such light emitting elements or electronic devices, and which are expressed by the general formula $In_xAl_yGa_{1-x-y}N$ ($0 \leq x$, $0 \leq y$, $0 \leq x+y \leq 1$), are generally difficult to obtain in the form of bulk single crystals. Consequently, various research has been performed into growing a nitride semiconductor, with few dislocation defects, on a type of substrate different from the nitride semiconductor, such as sapphire, silicon carbide, spinel, or silicon (see, for example, Japanese Laid-Open Patent Applications H11-191657 and 2001-102307).

With this kind of method, to reduce the number of dislocation defects, patterns of various materials and shapes are formed on a different type of substrate, and a nitride semiconductor layer is grown over this pattern to form a (11-22) plane, and the growth is continued further to join the planes together.

However, dislocations occur at plane joints in a nitride semiconductor layer. For instance, when a striped pattern is used, there is a limit to how much dislocation defects can be reduced because dislocations are generated along the plane joints that occur linearly on the substrate.

Also, stress is produced within the nitride semiconductor layer because of the differences in the lattice constant, coefficient of thermal expansion, and so forth between the different type of substrate and the nitride semiconductor, which can cause the nitride semiconductor layer to be severed from the different type of substrate, leading to warping in a freestanding state.

Furthermore, as shown in FIGS. 6a and 6b, even when a pattern consisting of an arrangement of regular triangular or regular hexagonal openings is used (see, for example, Japanese Laid-Open Patent Application 2000-223417), there is still no reduction in the dislocation defects that arise through dislocation occurring along the plane joints of a nitride semiconductor layer (at vertex portions where sides of regular triangular or regular hexagon intersect).

SUMMARY OF THE INVENTION

A nitride semiconductor substrate that is used to grow devices needs to be low in dislocations and to have less stress within the substrate. At the present time, however, no nitride semiconductor substrate that meets this need has been put to practical use.

With the present invention, dislocations can be reduced, and stress within the substrate can be dispersed so that substrate warpage is suppressed, that is, the warpage is lessened or reversed in its direction. An element grown on such a nitride semiconductor substrate will have better characteristics, and chip production will be easier.

The present invention provides a method for manufacturing a nitride semiconductor substrate, comprising the steps of:

growing a first nitride semiconductor on a substrate, patterning the first nitride semiconductor to obtain a pattern surrounded by a plane equivalent to the (11-20) plane and having at least two concave portions that are similar in their planar shape, and growing a second nitride semiconductor layer, using a plane equivalent to the (11-20) plane in the first nitride semiconductor pattern as a growth nucleus.

Further, the present invention provides a method for manufacturing a nitride semiconductor substrate, comprising the steps of:

forming a first nitride semiconductor pattern on a substrate, growing a second nitride semiconductor layer, using the first nitride semiconductor pattern as a growth nucleus, wherein the first nitride semiconductor pattern is formed by a plurality of frames with a substantially regular triangular planar shape, regularly disposed so that adjacent frames share only their apexes.

Moreover, the present invention provides a nitride semiconductor substrate, comprising:

a first nitride semiconductor pattern surrounded by a plane equivalent to the (11-20) plane, having at least two concave portions that are similar in their planar shape, and formed on a substrate, and a second nitride semiconductor layer formed on the first nitride semiconductor pattern.

Furthermore, the present invention provides a nitride semiconductor substrate, comprising:

a first nitride semiconductor pattern formed on a substrate, and a second nitride semiconductor layer formed on the first nitride semiconductor pattern, wherein the first nitride semiconductor pattern is formed by a plurality of frames with a substantially regular triangular planar shape, regularly disposed so that adjacent frames share only their apexes.

These and other objects, features, aspects and advantages of the present invention will become apparent to those skilled in the art from the following detailed description, which, taken in conjunction with the annexed drawings, discloses a preferred embodiment of the present invention.

DETAILED DESCRIPTION

Figure 1:
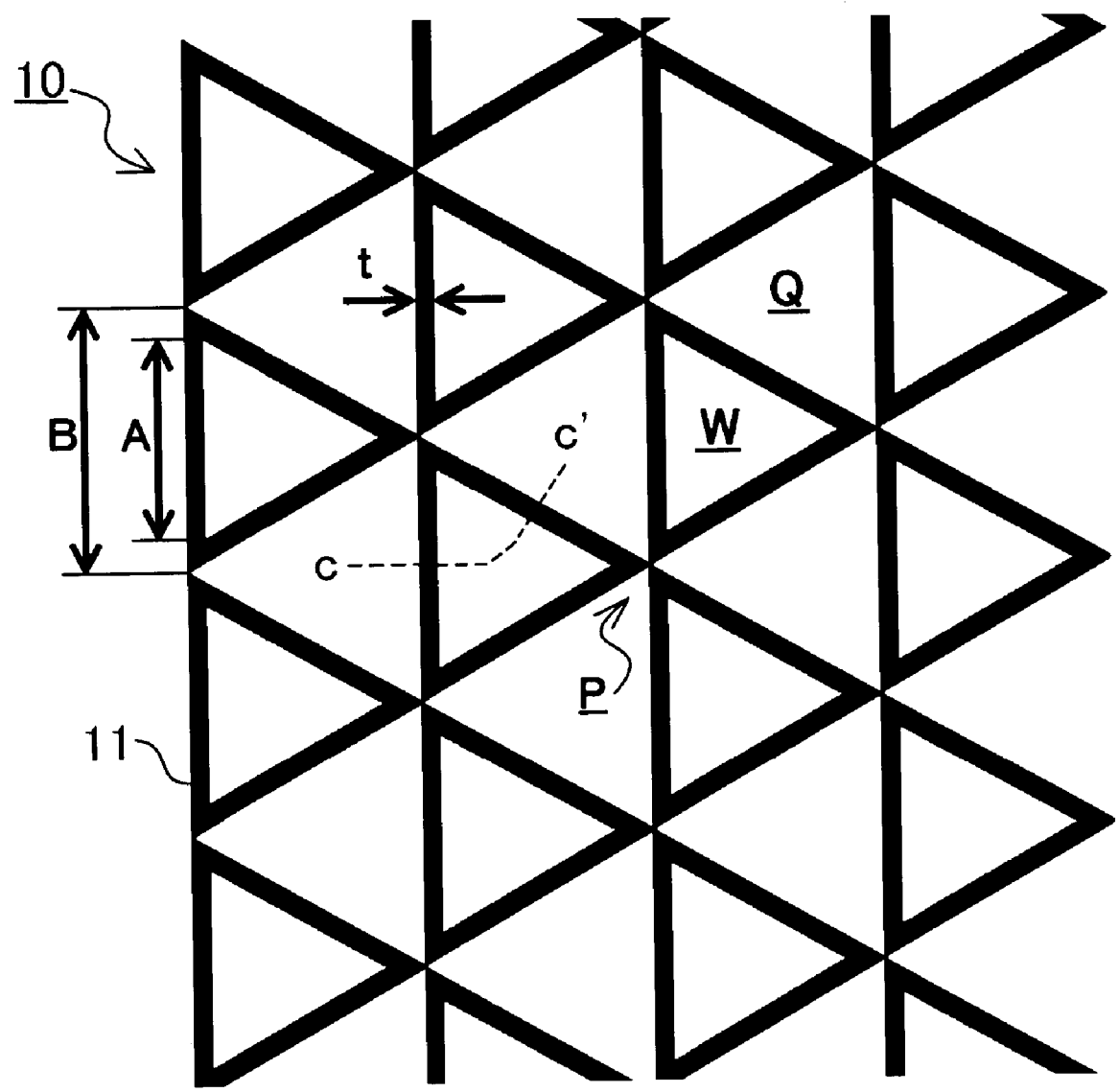
FIG. 1 is a plan view of the pattern used in the method of the present invention for manufacturing a nitride semiconductor substrate.

The method of the present invention for manufacturing a nitride semiconductor substrate mainly involves growing a first nitride semiconductor layer having a pattern of a specific shape on a substrate, and then growing a second nitride semiconductor layer by using this first nitride semiconductor layer as a growth nucleus.

The substrate used in the present invention may be any substrate on which a nitride semiconductor can be grown, examples of which include sapphire, silicon, SiC, GaAs, ZnS, ZnO, or the like having the C plane, R plane, or A plane as its main plane.

Of these, a sapphire substrate is preferable. Furthermore, the substrate preferably has an off angle or 10° or less, and better yet 0.1° to 1°.

With sapphire, for instance, the plane on which the nitride semiconductor is to be grown is the (0001) plane is. Since this means that the nitride semiconductor can also be grown in the (0001) plane, a plane that is equivalent to the (11-20) plane can be easily formed in the first nitride semiconductor layer. Besides the (0001) plane of sapphire, the plane on which the nitride semiconductor is grown may also be the (11-20) plane or the (1-100) plane.

First, a pattern consisting of a first nitride semiconductor layer is formed on a substrate.

The term "first nitride semiconductor layer" in the present invention refers to a layer composed of a nitride semiconductor expressed by the formula $In_xAl_yGa_{1-x-y}N$ ($0 \leq x$, $0 \leq y$, $0 \leq x+y \leq 1$). In addition to this, some of the layer may include boron as a group III element, and some of the nitrogen (group V element) may be replaced with phosphorus or arsenic. This nitride semiconductor layer may be grown as an i-type, or it may contain one or more n-type impurities, such as silicon, germanium, tin, sulfur, oxygen, titanium, zirconium, cadmium, or another such group IV element, or a group VI element, or may contain one or more p-type impurity such as magnesium, zinc, beryllium, manganese, calcium, or strontium. When an impurity is contained, the suitable concentration thereof is within a range of at least $5\times10^{16}/cm^3$ and no more than $1\times10^{21}/cm^3$, for example.

There are no particular restrictions on the method for growing the nitride semiconductor, and any known method for growing a nitride semiconductor, such as MOVPE (metalorganic vapor phase epitaxy), MOCVD (metalorganic chemical vapor deposition), HVPE (hydride vapor phase epitaxy), or MBE (molecular beam epitaxy), can be used preferably. The method for growing the nitride semiconductor is preferably selected as dictated by the intended use. Of these methods, however, MOCVD is preferable because it allows the nitride semiconductor to be growth with good crystallinity. More specifically, an example is a method in which a gas containing the elements constituting the first nitride semiconductor layer (such as ammonia gas or TMG gas) is supplied in a specific flux under a high temperature of about 950 to 1200° C. The first nitride semiconductor layer preferably has a thickness of no more than 5 μm, for example. The result is that the fact growth of the second nitride semiconductor layer (described below), which is grown from the first nitride semiconductor layer, to be carried out easily and reliably.

The pattern formation can be accomplished by any method known in this field, such as photolithography or etching. More specifically, a silicon oxide film is formed by CVD, this film is coated with a resist, and a pattern of the required shape is exposed. After this, developing is performed to form the resist into the required pattern. This resist pattern is used to etch the silicon oxide, and then the first nitride semiconductor layer is etched, thereby producing a pattern of the first nitride semiconductor layer having convex and concave portions of the required shape. The concave portions referred to here need only be thinner than the convex portions, but are preferably portions where there is no first nitride semiconductor layer. The top of the convex portions may be a plane equivalent to the (0001) plane. If there is any of the first nitride semiconductor layer at the bottom of the concave portions, there are no particular restrictions on this plane, but it may be, for example, a plane equivalent to the (0001) plane.

The pattern is formed in the first nitride semiconductor layer such that it may be surrounded by a plane equivalent to the (11-20) plane. The "plane equivalent to the (11-20) plane)" here refers to what is known as the A plane, and examples other than the (11-20) plane include the (1-210) and (-2110) planes. The phrase "surrounded by a plane equivalent to the (11-20) plane" means, for example, that the vertical cross sectional shape of this pattern, that is, the shape of a cross section perpendicular to the substrate surface, is substantially tetragonal, and the lateral side of this vertical cross sectional shape is formed so as to become a plane equivalent to the (11-20) plane. Forming the above-mentioned pattern of the present invention, rather than merely forming the first nitride semiconductor layer so that the A plane is part of the growth plane, makes it possible for the second nitride semiconductor layer (discussed below) to be facet grown more easily. It also effectively reduces dislocations.

From another standpoint, it may be better for the planar shape of the pattern to be a shape in which there are at least two similar (i.e., homothetic) concave portions, a shape in which the two or more similar concave portions are triangular, a shape in which a plurality of patterns that form a triangular shape are disposed in a matrix, a shape in which a pattern with a convex shape has an inner periphery and an outer periphery, a shape in which this inner periphery and outer periphery are similar, a shape in which this inner periphery and outer periphery are regular triangular in shape, and particular a shape in which a plurality of patterns that form a triangular shape have an inner periphery and an outer periphery. Here, it is better if the lateral faces of the pattern forming a triangular shape and the lateral faces of the pattern forming an inner periphery and outer periphery are all a plane equivalent to the (11-20) plane as discussed above. It is also better if the two or more similar concave portions, and the similar inner periphery and outer periphery are different in size by between 150 and 50%, for example.

Figure 6A:
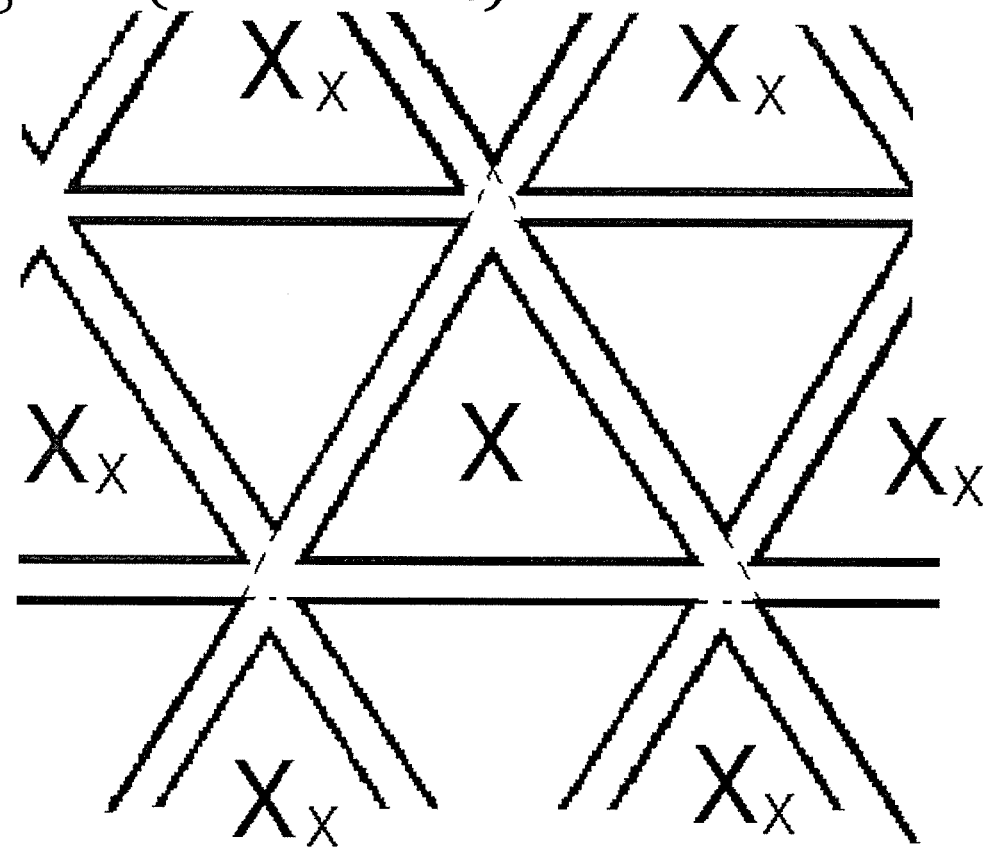
FIG. 6a to 6b are plan views of conventional patterns.
Figure 6B:
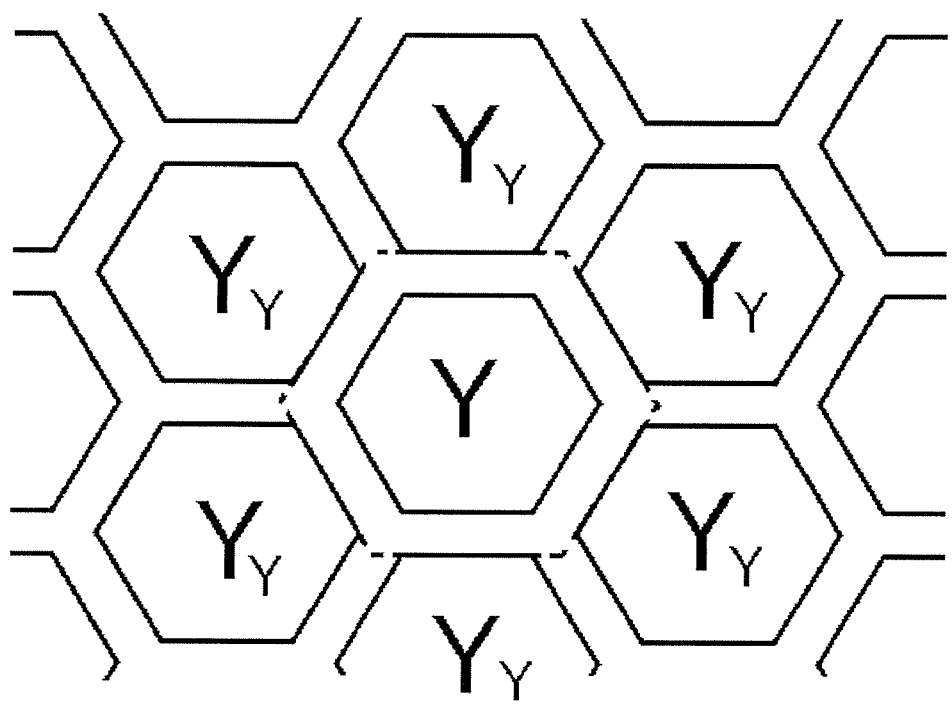

To put this another way, as shown in FIG. 1, the pattern is formed by a plurality of substantially triangular frames 11 that are regularly disposed so that adjacent frames share only their apexes. In this case, each frame 11 constitutes a single unit. Alternatively, the pattern is such that each of three apexes of this plurality of substantially regular triangles are disposed facing in the same direction (and disposed so that the sides of the plurality of regular triangles are arranged in a straight line), and adjacent substantially regular triangular frames are in contact only at their apexes. These frames are preferably formed in a convex shape. In this cases, it is preferable if concave portions of substantially the same shape as the outer peripheral shape of the frames are formed so as to be surrounded by the three substantially regular triangular frames. As shown in FIG. 1, all of the units (frames) have the same shape as the basic shape constituting the pattern (such as a triangular shape or regular triangular shape), and each one has the same shape as the others. As shown in FIGS. 6a and 6b, this is different from a situation in which the units of triangular or hexagonal frames share portions with adjacent frames, so that when one unit shape (such as the shapes indicated by X and Y in FIGS. 6a and 6b) is taken out, the shape of the adjacent units ($X_x$ and $Y_y$) is not necessarily the same as the basic shape, and these shapes are not the same as the others. The phrase "in contact only at their apexes" as used here means in a strict sense that the region of contact is a "point," but when the pattern formation method, the precision thereof, and so forth are taken into account, there may actually be a certain amount of deviation. This deviation may be, for example, a substantially circular region whose diameter is no more than one-half the width of the frame (discussed below), or a polygonal region having one side equal in length to said diameter, or a region whose diameter (or side) is no more than one-third, no more than one-fourth, no more than one-fifth, no more than one-eighth, or no more than one-tenth this width. In other words, this deviation may be, for example, such that center lines of adjacent frames do not cross.

Here, "triangular" preferably refers to a regular triangular or substantially regular triangular shape, and it is better if the length of one side of the triangle is about 40 to 100 μm, and preferably about 50 to 70 μm, with about 60 μm being better yet. If there is a frame, that is, an inner periphery and an outer periphery, then the length of one side of the outer periphery is preferably within the above range. If there is an inner periphery and outer periphery, the length of one side along the inner periphery is preferably about 20 to 60 μm, and more preferably about 40 to 55 μm. In other words, the width (t in FIG. 1) of the triangular frames is no more than 10 μm, and preferably about 1 to 5 μm. The width ((B−A)/2 in FIG. 1) of the frame at the apex portion is no more than 10 μm, and preferably about 1.5 to 6 μm. This shortens the time it takes to grow the second nitride semiconductor layer (discussed below), minimizes the density of dislocation defects in the resulting nitride semiconductor substrate, and also minimizes warping of the substrate if it is a freestanding substrate. In other words, as described below, this minimizes warping of a laminating layer of the semiconductor layer constituting the LED, LD, and the like.

This pattern is preferably regularly and uniformly laid out, which allows the portions with a high density of dislocation defects to be spaced regularly and kept to the minimum area. Also, the triangular shapes in the pattern, and particularly the triangular frames, are disposed so that only their apexes are in contact with the adjacent triangular frames, and do not share sides or come into contact at the sides. Put another way, the triangular frames may have slightly thick width at their apexes, or a substantially uniform width in almost all portions. The result of thus minimizing the area of the first nitride semiconductor layer (the growth nucleus) is that when facet growth is performed, that is, when a plane equivalent to the (11-22) plane is used as the growth plane, dislocations can be prevented from propagating to the second nitride semiconductor layer. Also, having the first nitride semiconductor pattern be in the above shape allows dislocations to be stopped during facet formation. Accordingly, dislocations can be concentrated in just the points corresponding to the centers of the patterns (such as triangles), and this reduces dislocation as compared to a pattern with a hexagonal or other such shape.

With the present invention, a buffer layer, intermediate layer, or the like may be formed from the nitride semiconductor layer prior to the formation of the first nitride semiconductor pattern. This buffer layer corresponds, for example, to what is known as a low temperature buffer layer. This layer can be formed, for instance, by a method in which a gas containing the elements constituting the nitride semiconductor layer to be obtained (such as ammonia gas or TMG gas) is supplied in a specific flux under a low temperature of about 450 to 600° C. The suitable thickness of this layer is 0.1 μm or less, for example.

Also, with the present invention, after the first nitride semiconductor layer has been formed, the exposed substrate surface may be covered with silicon oxide, silicon nitride, titanium oxide, zirconium oxide, a multilayer film of these, or a high-melting point metal with a melting point of at least 1200° C. (such as tungsten or molybdenum). That is, the second nitride semiconductor layer (discussed below) may be grown on the surface of silicon oxide and the first nitride semiconductor layer. An example of the method for thus coating with silicon oxide is a method in which silicon oxide is formed in a specific thickness over the entire surface of the substrate, including the first nitride semiconductor pattern, and just the silicon oxide is etched away from the first nitride semiconductor pattern by an etching method known in this field. Examples of methods for forming a protective film include CVD, sputtering, and vapor deposition. Dry etching or wet etching can be used to remove the protective film, and both methods allow the protective film to be removed without lowering the crystallinity of the nitride semiconductor. Furthermore, dry etching makes it simple to control the depth to which the protective film is removed.

The second nitride semiconductor layer is grown over the first nitride semiconductor pattern, which has been patterned in a specific shape. Examples of methods for growing the second nitride semiconductor layer are the same as those described above for the method for growing the first nitride semiconductor layer. However, since the first nitride semiconductor pattern has already been formed, the second nitride semiconductor layer is grown by using as the growth nucleus a plane equivalent to the (11-20) plane in the first nitride semiconductor pattern, and thus can be grown by so-called facet growth, in which the center of the first nitride semiconductor pattern serves as the apex. The "facet growth" referred to here means growth in a different direction from the initial or original growth direction of the nitride semiconductor layer. Usually, the nitride semiconductor layer is grown at a plane other than the C plane, and preferably at the (11-22) plane.

When the growth of the second nitride semiconductor layer is continued, the so-called fact growth plane gradually changes into a flat plane. The progress of dislocations at the apexes of the facet growth here can be effectively prevented in the second nitride semiconductor layer (see FIG. 2b). Also, if voids are formed (see FIG. 2e) or the plane joints are stuck together at the portions when adjacent facet growth planes are joined together, then even if there should be through-dislocations, or if new through-dislocations should occur, the through-dislocations will progress only directly over the points of these voids or joints. In the end, a layer can be growth that is flat and horizontal on the substrate surface, that is, over the entire surface in the C plane direction. Further, the above-mentioned pattern may be formed over the second nitride semiconductor, and a third nitride semiconductor may be regrown anew. This reduces dislocations even further. The thickness of the second nitride semiconductor layer is at least 50 μm, for example, and preferably at least 100 μm. This film thickness allows the substrate to be removed more easily.

As discussed above, with a nitride semiconductor substrate comprising a first nitride semiconductor pattern and a second nitride semiconductor layer formed on a substrate, whether or not a pattern has been formed by the first nitride semiconductor layer of the specific shape described above can be determined by observing facet growth, the plane joints of the growth plane, and/or the direction of dislocations, etc., by observation of the back side with an optical microscope, or, if devices have been formed on this substrate, by various methods such as cross sectional observation or surface observation after electrodes and so forth have been removed.

The substrate is preferably removed after the second nitride semiconductor layer has been formed. This allows a freestanding nitride semiconductor substrate to be obtained. This removal of the substrate can be accomplished by any method known in this field. For instance, the substrate can be removed with a laser. Here, not just the substrate, but also the above-mentioned buffer layer, intermediate layer, first nitride semiconductor layer, and some of the second nitride semiconductor layer may also be removed. Also, the layer, which can be recognized by observing described above as a layer formed by using the first nitride semiconductor pattern of the specific shape described above, may be fully removed.

In the freestanding nitride semiconductor substrate obtained in this way (i.e., the substrate which is used to form the nitride semiconductor layer at least was removed) warping occurs downward in the negative direction (protruding on the front side). It is preferable for warping to be a range equal to or less than about −300 μm. Consequently, when a nitride semiconductor layer is laminated over such the substrate to form an LED, LD, or other such semiconductor device, the warping of the nitride semiconductor layer itself can be cancelled out or lessened by this substrate.

An example of the method for manufacturing a nitride semiconductor substrate of the present invention will now be described in detail.

EXAMPLE

A sapphire substrate was provided, which had the C plane as its main plane and the A plane as its orientation flat plane, and which had an off angle of approximately 0.5°.

A buffer layer was grown on this sapphire substrate by MOCVD at 500° C. for 3 minutes, while supplying hydrogen as the carrier gas 8 slm $NH_3$ as the raw material gas, and TMG (trimethyl gallium) at 35 μmol/minute. The thickness of the resulting buffer layer was 0.02 μm.

Figure 2A:
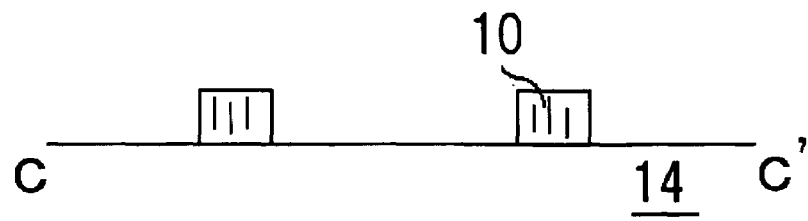
FIG. 2a to 2e are cross section of the pattern in FIG. 1 along the c-c' line, and are cross section of the nitride semiconductor layer when a second nitride semiconductor layer was grown over this pattern.

Next, in the same manner as above, a first nitride semiconductor layer of GaN was grown for 60 minutes at 1100° C. while supplying 4 slm $NH_3$ and TMG at 230 μmol/minute. The thickness of the resulting GaN layer was 2 μm. Next, an $SiO_2$ film with a thickness of 1 μm was formed over this GaN layer with a CVD apparatus. This was coated with a resist, and a mask pattern was exposed using a stepper. After this, the resist was developed and dry etching was performed to etch first the $SiO_2$ film and then the GaN layer (first nitride semiconductor layer). The remaining $SiO_2$ film was removed to form a pattern 10 composed of a GaN layer with the shape shown in FIG. 1, over a substrate 14 as shown in FIG. 2a.

This pattern 10 consisted of a uniform arrangement of convex, regular triangular frames 11. In other words, there were two concave portions Q and W that were similar in their planar shape. All of the regular triangular frames 11 had each of their three apexes disposed facing the same direction as those of the other frames. The length B of one side along the outer periphery of the regular triangle was approximately 60 μm, the length A of the side on the inner periphery was approximately 50 μm, and the width t of the frame was approximately 3 μm. With this pattern 10, adjacent triangular frames 11 are in point contact at just their apexes P. That is, three triangular frames 11 are in point contact at just their apexes P. To put this another way, concave portions Q with substantially the same shape as the outer peripheral shape of the frames 11 are formed so as to be each surrounded by three triangular frames 11.

Figure 2B:
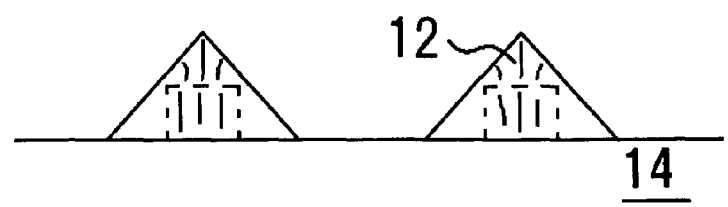

Next, as shown in FIG. 2b, GaN (the second nitride semiconductor layer 12) was grown for 6 hours in the same manner as above, using the pattern 10 of the first nitride semiconductor layer as a growth nucleus, at 1000° C. while supplying 4 slm $NH_3$ and TMG at 60 μmol/minute. Using the pattern 10 as the growth nucleus here resulted in the second nitride semiconductor layer 12 being grown at the facet plant, that is, at a plane equivalent to the (11-22) plane. The progress of through-dislocations here was prevented by the apexes of the face planes.

Figure 2C:
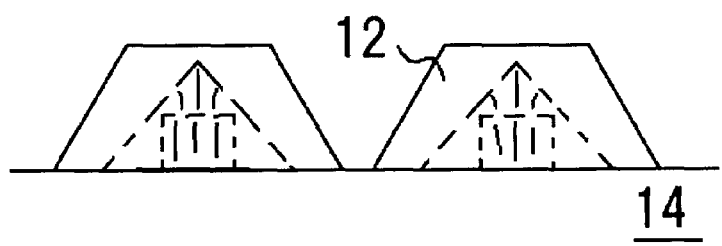
Figure 2D:
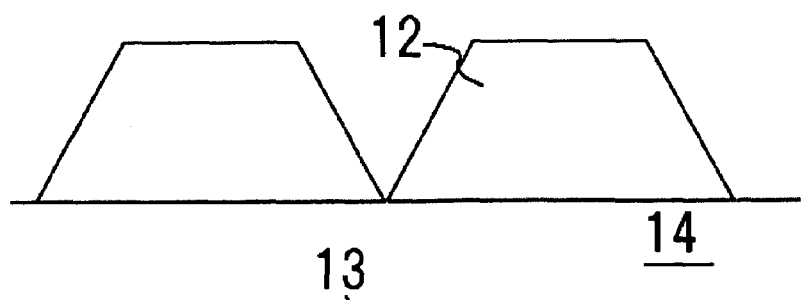
Figure 2E:
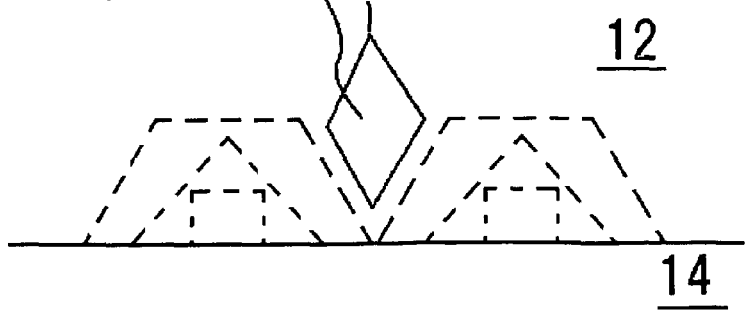

Continuing on, GaN was grown for 12 hours while supplying 4 slm $NH_3$ and TMG at 200 μmol/minute, and a facet plane was grown while the surface of the second nitride semiconductor layer 12 gradually changed into the C plane as shown in FIGS. 2c and 2d, and finally, as shown in FIG. 2e, voids 13 were formed at joint portions while a flat plane was obtained.

After this, the back side was irradiated with a laser to remove the sapphire substrate and obtain a nitride semiconductor substrate with a thickness of 150 μm.

The nitride semiconductor substrate thus obtained was measured for dislocation density and warping, and a CL (cathode luminescence) image was taken.

For the sake of comparison, nitride semiconductor substrates were formed in the same manner as in the above example, except that the pattern shape of the first nitride semiconductor layer was changed to stripes with a line width of 10 μm and a pitch of 20 μm, and also, as shown in FIG. 6b, hexagonal patterns were regularly disposed, with the distance to the adjacent hexagonal patterns being 50 μm.

Figure 3:
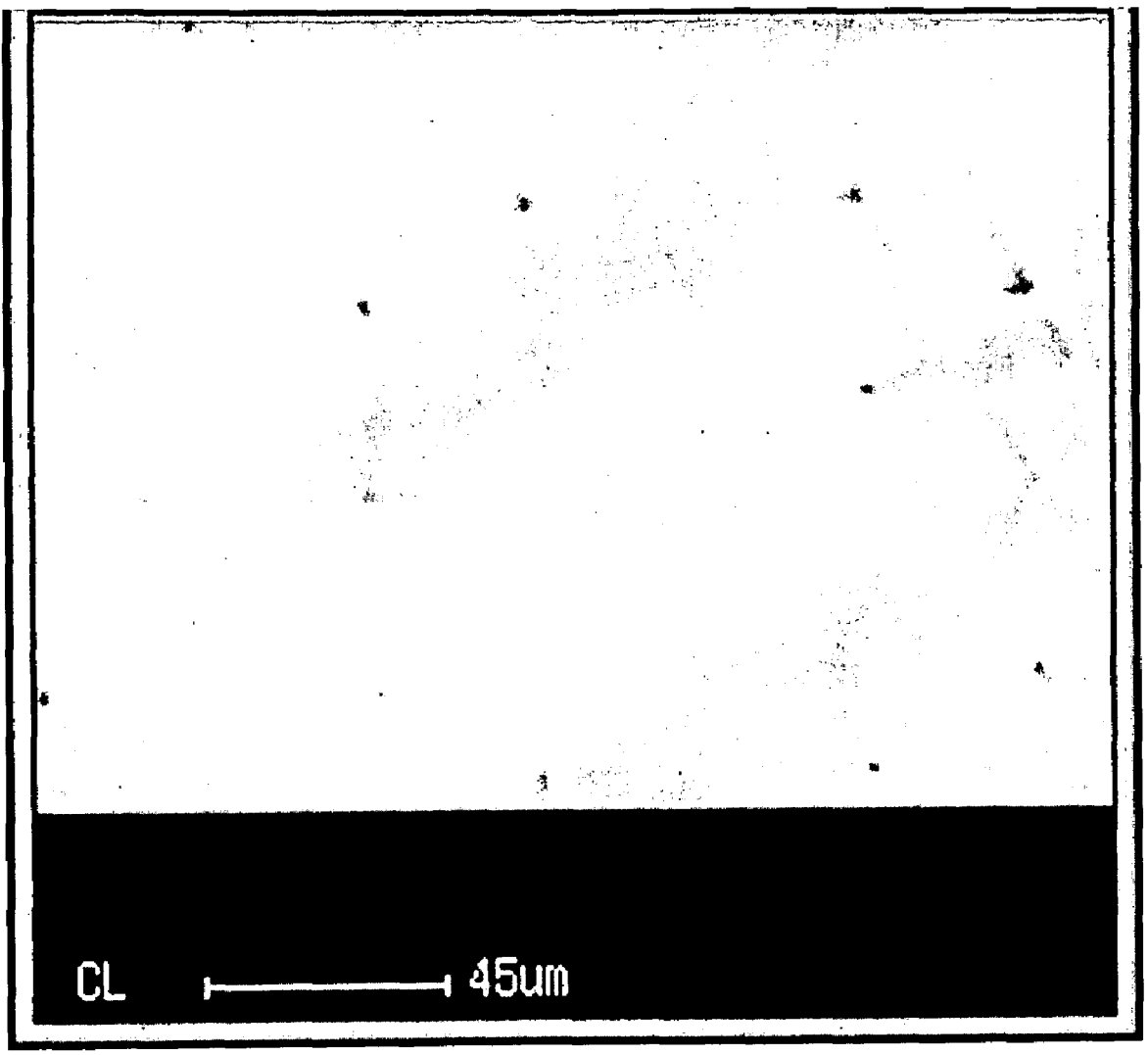
FIG. 3 is a photograph showing a CL image of the nitride semiconductor substrate surface formed using the pattern of the example.
Figure 4:
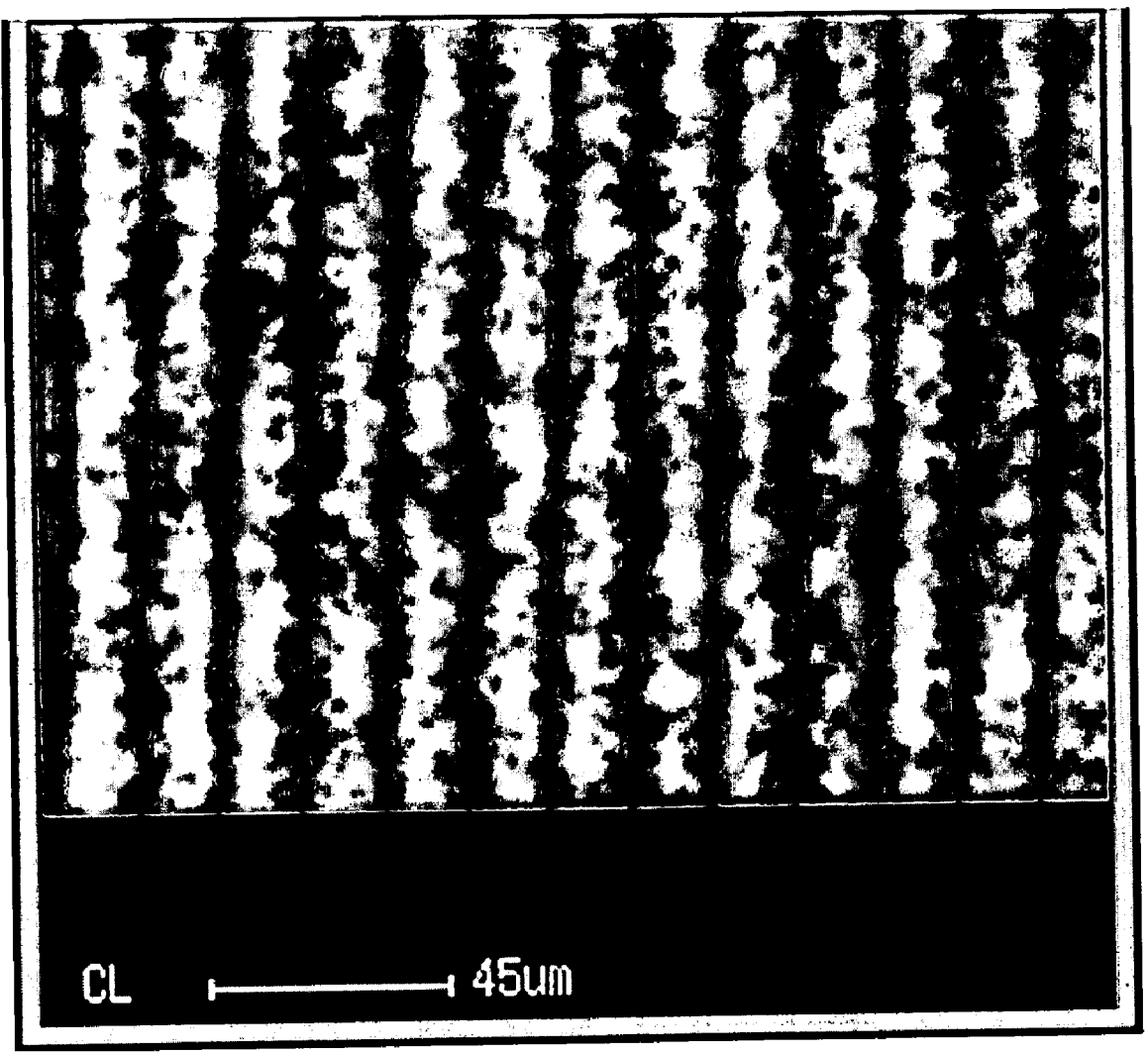
FIG. 4 is a photograph showing a CL image of the nitride semiconductor substrate surface formed using the striped pattern of a comparative example.
Figure 5:
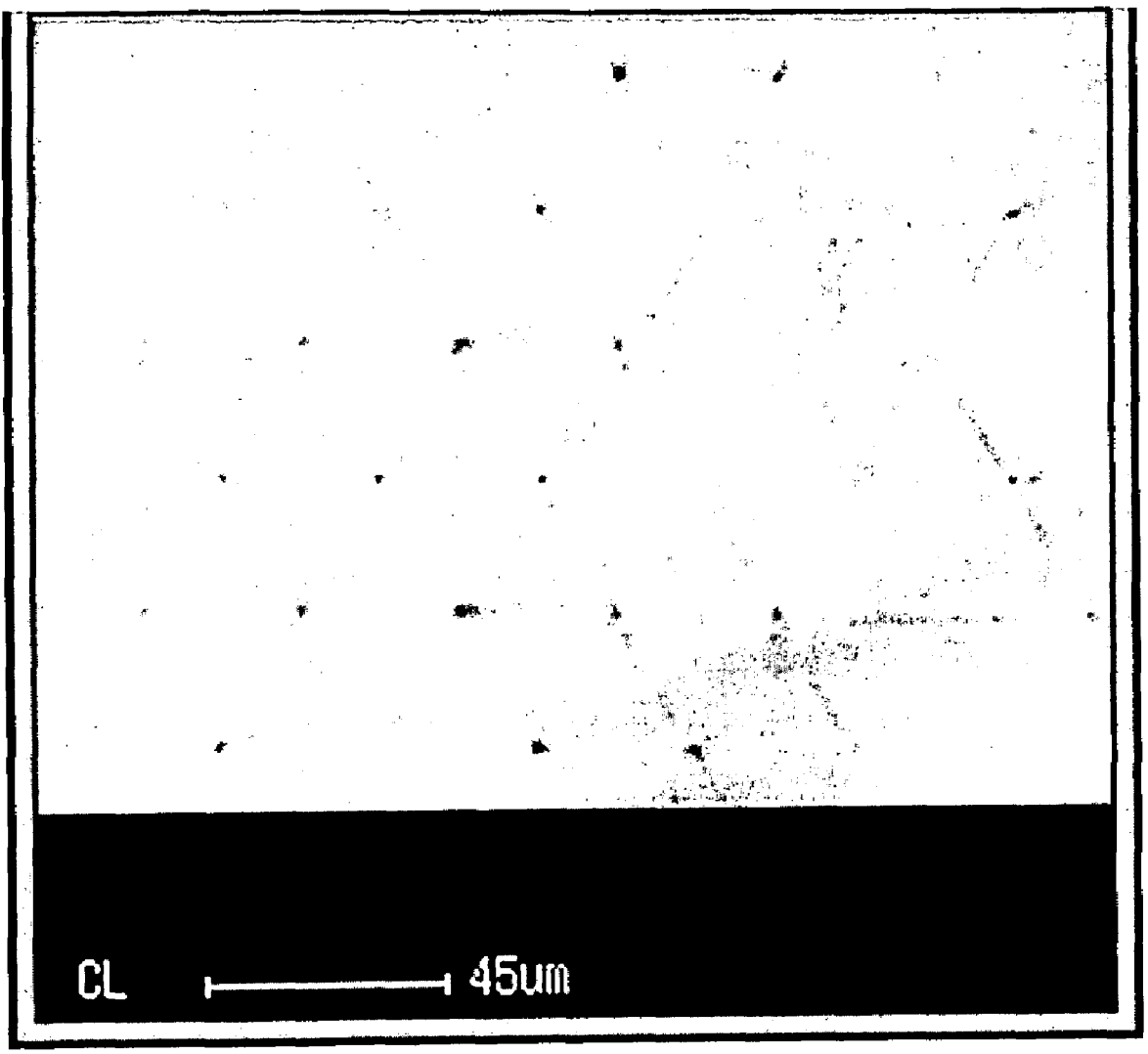
FIG. 5 is a photograph showing a CL image of the nitride semiconductor substrate surface formed using the hexagonal pattern of another comparative example.

These results are given in Table 1. FIG. 3 shows a CL image of the product of the example, FIG. 4 shows that of the product obtained using a striped pattern, and FIG. 5 shows that obtained using a hexagonal pattern.

TABLE 1

|  | Dislocation density ($cm^{-2}$) | Warping (μm) |
|---|---|---|
| Example (triangular frames) | $3.0 \times 10^6$ | −200 to 0 |
| Comparative Example (striped) | $5.0 \times 10^8$ | 200 |
| Comparative Example (hexagonal) | $5.0 \times 10^6$ | 0 to 50 |

As is clear from Table 1, when the pattern was striped, because facet bonding occurred linearly, dislocations occurred linearly and continuously, so the reduction in dislocations was inadequate. Also, warping increased after the substrate was removed.

Also, while warping after substrate removal did decrease with a hexagonal pattern, through-dislocations occurred at each apex of the hexagons, so while there were fewer dislocations than with the striped pattern, the reduction in dislocations was still inadequate.

On the other hand, with the pattern of Example, facet growth for lateral growth can be isotropically bonded, and this means that because bonding is concentrated at the center point of the triangular frame, for example, even though through-dislocations are present, these dislocations themselves are concentrated at the center point of the triangular frame, so a sufficient reduction in dislocations can be achieved. Also, warping after substrate removal was only warping from zero downward in the negative direction (protruding on the front side).

Consequently, when a nitride semiconductor layer (such as one with a thickness of about 30 to 1000 μm, and preferably about 100 to 900 μm) is laminated over such a substrate to form an LED, LD, or other such semiconductor device, the warping of the nitride semiconductor layer itself can be cancelled out or lessened by this substrate, so the shape stability of the substrate itself is good, or the semiconductor devices formed on the substrate will be more stable and easier to handle, which affords a higher yield in the process of producing semiconductor device chips and so forth.

The method of the present invention for manufacturing a nitride semiconductor substrate can be used in the manufacture of all semiconductor apparatus that make use of nitride semiconductors.

This application claims priority to Japanese Patent Applications No. JP-2005-314688 and No. JP-2006-224023. The entire disclosure of Japanese Patent Applications No. JP-2005-314688 and No. JP-2006-224023 are hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A nitride semiconductor substrate, comprising:
a first nitride semiconductor pattern surrounded by a plane equivalent to the (11-20) plane, having at least two concave portions that are similar in their planar shape, and formed on a substrate, and
a second nitride semiconductor layer formed on the first nitride semiconductor pattern.

2. A nitride semiconductor substrate, comprising:
a first nitride semiconductor pattern formed on a substrate, and
a second nitride semiconductor layer formed on the first nitride semiconductor pattern,
wherein the first nitride semiconductor pattern is formed by a plurality of frames with a substantially regular triangular planar shape, regularly disposed so that adjacent frames share only their apexes.

3. The nitride semiconductor substrate according to claim 1, wherein the first nitride semiconductor pattern includes a convex portion whose inner periphery and outer periphery are similar in their planar shape.

4. The nitride semiconductor substrate according to claim 3, wherein the first nitride semiconductor pattern includes a convex portion whose inner periphery and outer periphery are substantially regular triangular planar shape.

5. The a nitride semiconductor substrate according to claim 2, wherein each single frame in the first nitride semiconductor pattern is such that the inner periphery and outer periphery are substantially regular triangular in their planar shape.

* * * * *